United States Patent
Zhang et al.

(10) Patent No.: US 10,382,138 B2
(45) Date of Patent: Aug. 13, 2019

(54) CONSTELLATION OPTIMIZATION BASED ON GENERALIZED MUTUAL INFORMATION OVER A NONLINEAR OPTICAL CHANNEL

(71) Applicant: NEC Laboratories America, Inc., Princeton, NJ (US)

(72) Inventors: Shaoliang Zhang, Princeton, NJ (US); Fatih Yaman, Princeton, NJ (US); Eduardo Mateo Rodriguez, Tokyo (JP); Yoshihisa Inada, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/912,852

(22) Filed: Mar. 6, 2018

(65) Prior Publication Data
US 2018/0269979 A1    Sep. 20, 2018

Related U.S. Application Data

(60) Provisional application No. 62/467,355, filed on Mar. 6, 2017.

(51) Int. Cl.
| | | |
|---|---|---|
| H04L 1/00 | (2006.01) |
| H03M 13/11 | (2006.01) |
| H03M 13/25 | (2006.01) |
| H04B 10/27 | (2013.01) |
| H04B 10/58 | (2013.01) |
| H04L 27/34 | (2006.01) |
| H04L 27/36 | (2006.01) |
| H04B 10/2543 | (2013.01) |

(Continued)

(52) U.S. Cl.
CPC .... *H04B 10/5161* (2013.01); *H03M 13/1102* (2013.01); *H03M 13/255* (2013.01); *H04B 10/2543* (2013.01); *H04B 10/27* (2013.01); *H04B 10/516* (2013.01); *H04B 10/541* (2013.01); *H04B 10/58* (2013.01); *H04L 1/0041* (2013.01); *H04L 1/0071* (2013.01); *H04L 27/3405* (2013.01); *H04L 27/366* (2013.01); *H04L 1/0057* (2013.01)

(58) Field of Classification Search
CPC ............ H04B 10/5161; H04B 10/2543; H04B 10/27; H04B 10/58; H04B 10/541; H04B 10/516; H03M 13/1102; H04L 1/0041; H04L 1/0071; H04L 27/3405; H04L 27/366
USPC ......................................... 398/185, 186, 159
See application file for complete search history.

(56) References Cited

U.S. PATENT DOCUMENTS

| | | | | |
|---|---|---|---|---|
| 5,991,337 A | * | 11/1999 | Giles ...................... | H04L 1/0001 375/222 |
| 6,904,082 B2 | * | 6/2005 | Jones .................... | H04L 5/0046 375/220 |

(Continued)

OTHER PUBLICATIONS

Alex Alvarado, Four-Dimensional Coded Modulation with Bit-wise Decoders for future optical communication, Jan. 20, 2015.*

(Continued)

*Primary Examiner* — Abbas H Alagheband
(74) *Attorney, Agent, or Firm* — Joseph Kolodka

(57) ABSTRACT

Aspects of the present disclosure describe methods of generating an optimized set of constellation symbols for an optical transmission network wherein the optimized constellation is based on GMI cost and considers both fiber nonlinearity and linear transmission noise.

1 Claim, 14 Drawing Sheets

(51) Int. Cl.
*H04B 10/54* (2013.01)
*H04B 10/516* (2013.01)

(56) References Cited

U.S. PATENT DOCUMENTS

| | | | | |
|---|---|---|---|---|
| 8,112,001 | B2* | 2/2012 | Lowery | H04B 10/2543 |
| | | | | 398/158 |
| 8,155,534 | B2* | 4/2012 | Winzer | H04B 10/505 |
| | | | | 398/185 |
| 9,491,023 | B2* | 11/2016 | Butussi | H03M 7/30 |
| 9,503,305 | B1* | 11/2016 | Mitra | H04L 1/0047 |
| 9,749,058 | B2* | 8/2017 | Reimer | H04B 10/2507 |
| 9,806,739 | B1* | 10/2017 | Kojima | H03M 7/30 |
| 2015/0049844 | A1* | 2/2015 | Stott | H04L 1/0041 |
| | | | | 375/298 |
| 2015/0172079 | A1* | 6/2015 | Eliaz | H04L 25/03178 |
| | | | | 375/285 |
| 2016/0094895 | A1* | 3/2016 | Stadelmeier | H04H 20/59 |
| | | | | 725/33 |
| 2016/0373190 | A1* | 12/2016 | Reimer | H04B 10/2507 |
| 2017/0026222 | A1* | 1/2017 | Butussi | H03M 7/30 |
| 2017/0288935 | A1* | 10/2017 | Montorsi | H04L 27/3422 |
| 2018/0227161 | A1* | 8/2018 | Zhang | H04B 10/541 |

OTHER PUBLICATIONS

Toshiaki Koike-Akino et al., "GMI-Maximizing Constellation Design with Grassmann Projection for Parametric Shaping", Mar. 2016 (Year: 2016).*

Alex Alvarado et al."Four-Dimensional Coded Modulation with Bit-wise Decoders for Future Optical Communications", Jan. 21, 2015 (Year: 2015).*

\* cited by examiner

CONSTELLATION OPTIMIZATION BASED ON GENERALIZED MUTUAL INFORMATION OVER A NONLINEAR OPTICAL CHANNEL

CROSS REFERENCE TO RELATED APPLICATIONS

This application claims the benefit of U.S. Provisional Patent Application Ser. No. 62/467,355 filed Mar. 6, 2017 which is incorporated by reference as if set forth at length herein.

TECHNICAL FIELD

This disclosure relates generally to optical communications and more specifically to a novel method of constellation optimization based on generalized mutual information over a nonlinear optical channel.

BACKGROUND

As is known, transmission reach in coherent optical transmission systems has been limited by both receiver sensitivity of modulation formats and fiber nonlinearities. Since the development/deployment of digital coherent receiver and digital transmitters enabled by high-speed analog-to-digital converters (ADC) and digital-to-analog converters (DAC) it has proven to be relatively straightforward to apply standard modulation formats—such as M-ary quadrature amplitude modulation (QAM) from well-developed wireless communications fields, to optical transmission thereby reaching different distances at corresponding spectral efficiencies. To further extend transmission reach, low-density parity check (LDPC) codes have been used to reduce the forward error correction (FEC) limit with soft-decision inputs to decoders. Unfortunately, the performance of the same LDPC codeword could perform differently in different modulation formats due to the bit mapping and constellation geometric shapes. In particular, for non-Gray-mapping constellation(s), it is desirable to design an optimized constellation to reduce the performance loss of LDPC.

In non-Gray mapping constellations, iterative decoding has been proposed in the art to take advantage of a tilted demodulator transfer curve in an extrinsic information transfer IEXIT) chart by continuing to exchange information between LDPC decoders and demappers. As the art has learned however, the complexity of this approach is too high to be implemented in any practical high-speed optical transceiver (See, e.g., J. X. Cai et al., "64 QAM based coded modulation transmission over transoceanic distance with >60 Tb/s capacity," 2015 Optical Fiber Communications Conference and Exhibition (OFC), Los Angeles, Calif., 2015, pp. 1-3).

Accordingly, and instead of working directly on non-Gray mapping constellation(s), probabilistic-shaped constellation over Gray-mapping constellation ($2^m$-QAM, m=even integers) have been proposed and demonstrated to achieve the Shannon limit at back-to-back (BTB) scenarios by allocating additional overhead to constellation shaping and FEC (See, e.g., Ghazisaeidi, Amirhossein, et al. "Advanced C+L-Band Transoceanic Transmission Systems Based on Probabilistically-Shaped PDM-64QAM", Journal of Lightwave Technology (2017); Chandrasekhar, Sethumadhavan, et al., "High-spectral-efficiency transmission of PDM 256-QAM with parallel probabilistic shaping at record rate-reach tradeoffs", ECOC 2016-Post Deadline Paper; $42^{nd}$ European Conference on Optical Communications, Proceedings of, VDE, 2016). Due to the impact of fiber nonlinearity however, the probabilistic-shaped QAM suffers more nonlinearity penalties, thus making its transmission reach not as expected in the BTB case. Moreover, the encoding and decoding of non-uniform symbols are not trivial to be implemented in real-time high-speed coherent optical transceivers.

Geometrical shaping has been designed for Gray-mapping—such as amplitude-phase shift keying (APSK) for linear back-to-back noise case(s). Even though GMI capacity of geometrical shaping is better than standard QAM (See, e.g., S. Zhang et al., "Capacity-Approaching Transmission Over 6375 km Using Hybrid Quasi-Single-Mode Fiber Spans", in Journal of Lightwave Technology, vol. 35, no. 3, pp. 481-487, Feb. 1, 2017), the nonlinearity tolerance after transmission is not guaranteed because the fiber nonlinearity is modulation dependent.

SUMMARY

An advance in the art is made according to aspects of the present disclosure directed to an improved method for designing optimized modulation formats based on bit-interleaved coded modulation (BICM) without resource-hungry iterative decoding, and the optimization of the modulation formats is carried out in an optical nonlinear channel to guarantee transmission reach.

Operationally, and according to aspects of the present disclosure, a target constellation with specified bits mapping and geometric shapes is used as an input to our method. Next, channel parameters are provided to the method to model fiber nonlinearity. Note that the fiber function is now changed to maximize the generalized mutual information (GMI) after the channel model at the optimized channel power, corresponding to the capacity of FEC without iterative decoding. The optimization is performed to find the optimized constellation in the given channel. The optimized constellation is capable of reducing the impact of non-Gray-mapping constellation on the performance loss of LDPC and mitigates nonlinearity impact after transmission.

Advantageously, and as will become apparent to those skilled in the art, methods according to the present disclosure allow the optimization of constellation to be performed specifically for a given transmission system including both fiber nonlinearity and linear transmission noise. The optimized constellation can be shown to outperform standard $2^m$-QAM and APSK at both BTB and transmission due to a better geometric shape. By applying the GMI metric as the cost function, FEC performance of the optimized constellation formats may be achieved by simple BICM scheme(s), and thus have less complexity to the design of coherent optical transceivers. Finally, it is shown that performance loss of non-Gray-mapping optimized constellation after FEC decoding is much smaller than standard $2^m$-QAM. Of additional advantage, our method scales well to any N-dimensional constellation at reasonable complexity cost.

BRIEF DESCRIPTION OF THE DRAWING

A more complete understanding of the present disclosure may be realized by reference to the accompanying drawing in which:

FIG. 7(A) experimental setup of C/L band transmitter; FIG. 7(B) bi-directional recirculation loop; and FIG. 7(C) spectra of C and L band signals after 11185 km transmission at 0.1 nm resolution—all according to aspects of the present disclosure;

DESCRIPTION

Figure 1:
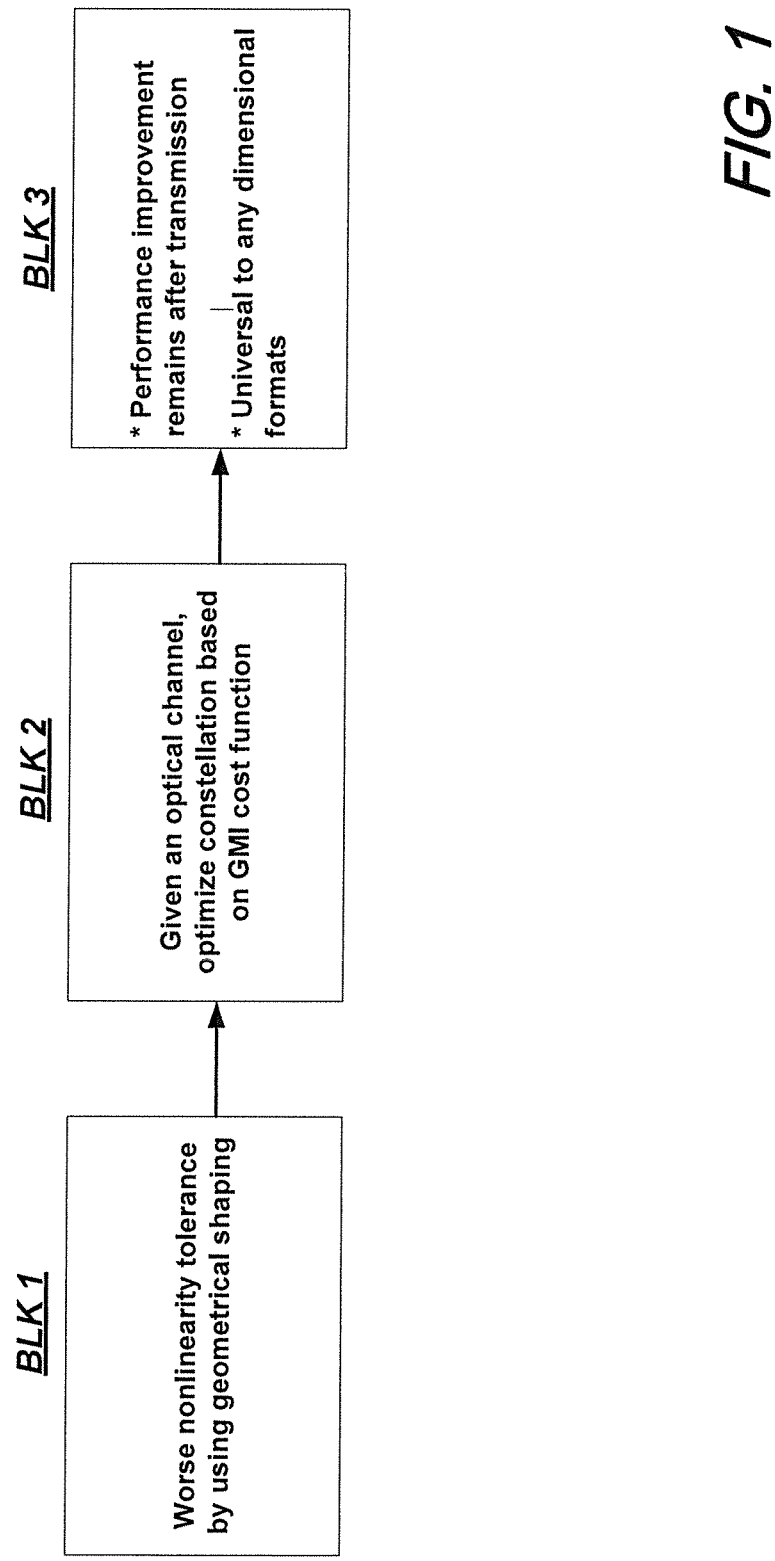
FIG. 1 is a schematic flow diagram illustrating an overview of methods according to aspects of the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the FIGs comprising the drawing are not drawn to scale.

Turning now to FIG. 1, there is shown a high level flow/block diagram providing an illustrative overview of methods according to the present disclosure. As may be observed from that figure, we note at block 1 that one will generally achieve a worse(ned) nonlinearity tolerance by using geometrical shaping. Accordingly—the present disclosure when given an optical channel will optimize a constellation based on a generalized mutual information (GMI) cost function. As a result, performance improvement remains after transmission and advantageously it is applicable to any dimensional format(s).

At this point we describe the generalized mutual information (GMI) according to aspects of the present disclosure. In an additive white Gaussian noise (AWGN) channel with discrete N-dimensional (N-dim) signal inputs X and noise Z, the channel outputs can be represented as Y=X+Z, where the noise Z is an N-dim Gaussian random vector with zero mean and covariance $$\frac{\sigma_n^2}{N} I_{N \times N} \cdot I_{N \times N}$$

denotes a N×N identity matrix. The input X is taken from an N-dim signal constellation $\{x_1, x_2, \ldots, x_M\}$ at a specified probability mass function (PMF) given by $p(x_i), i \in \{1, 2, \ldots, M\}$. The average signal power is $E_s = E[\|X\|^2] = \Sigma_i p(x_i) \|x\|^2 M_{=1}$, where $\|\cdot\|$ represents norm operation of a vector, and the signal-to-noise ratio (SNR) is defined as SNR $$\frac{E_s}{\sigma_n^2}.$$

The Shannon capacity defines the maximum achievable rate of this channel, i.e., $$C_{Shannon} = \frac{N}{2} \log_2 (1 + SNR).$$

When using constellation X with a limited M alphabet size, the maximum achievable rate is given by its mutual information (MI) I(X;Y), which is usually used for characterizing the system AIR in a non-binary coding system [14]. In a practical and widely commercially-deployed bit-interleaved coded modulation (BICM) system, MI can be achievable when applying high-complexity iterative decoding scheme. However, when bit-metric decoding (BMD) is used, its rate is shown to be $$R_{BMD} = H(X) - \sum_{i=1}^{m} H(B_i | Y), \quad (1)$$

where H(X) denotes the entropy of signal X associated with a PMF $p(x_i), x_i \in \{1, 2, \ldots, M\}$, and is defined as $H(X) = -\sum_{i=1}^{M} p(x_i) \times \log_2 p(x_i)$.

The conditional entropy $H(B_i|Y)$ computes uncertainty between the random binary variables $B_i \in \{0,1\}$ at ith position and the channel output Y. When a sub-optimum mismatched decoder is used, Rump is shown to be equivalent to the GMI $R_{GMI}$ [13] for the independent bits-levels [15]. Note that the optimized constellation considered in this paper has independent bit-levels, thereby making $R_{BMD} = R_{GMI}$.

Monte-Carlo simulation is illustratively performed in this disclosure to calculate the GMI by generating random symbols from constellation X following a given PMF $p(x_i)$. Its GMI can be computed as $$R_{GMI} = -\mathbb{E}[\log_2 p(x_i)] + \sum_{i=1}^{\log_2 M} \mathbb{E}\left[\log_2 \frac{\sum_{i=1}^{M}\sum_{b=0}^{1} p(y|x_i^b)p(x_i^b)\mathbb{1}(x_i^b)}{\sum_{j=1}^{M} p(y|x_j)p(x_j)}\right], \quad (2)$$

Here, $p(y|x_j)$ represents the conditional probability of the received channel outputs given the input symbol $x_j$, $x_i^b$ denotes the transmitted symbol with bit $b \in \{0,1\}$ at ith position, $\mathbb{1}(x_i^b)$ is an indicator function that equals to 1 when $x_i^b = b$ otherwise 0.

In the Monte-Carlo simulation, due to the assumption of AWGN characteristics, (2) can be approximated by $$R_{GMI} = H(X) + \sum_{i=1}^{\log_2 M} \left\langle \log_2 \left[\frac{b_i(j) \cdot L_1(j) + (1 - b_i(j)) \cdot L_0(j)}{p_y(j)}\right]\right\rangle, \quad (3)$$

where $b_i(j) \in \{0,1\}$ denotes the transmitted bits for the jth symbol at ith bit and $p_y(j)$ is the probability of the received jth symbol y(j). The operator • represents the arithmetic average over all the simulated symbol index j. $L_0$ and $L_1$ stand for the bit likelihood (L) for the received jth symbol y(j), which can be computed based on the following equation:

$$L^j = \sum p(y(j)|x^{b_i=0,1})p(x_{b_i=0,1\ i=0,1}^b) \quad (4)$$

$$\sum_{b_i=0,1} (2\pi\sigma^2)^{-n/2} \exp\left(-\frac{\|y(j) - x^{b_i=0,1}\|^2}{2\sigma^2}\right)^{x b_i=0,1}_x = p(x_{b_i=0,1}),$$

where $\sigma^2 \triangleq \sigma_n^2/N$ is the noise variance in each dimension. Note that $\rho^2$ can be estimated from the recovered constellation in the experiments. The derived GMI in (3) can be applied in both uniform and non-uniform multi-dimensional constellation.

Figure 2:
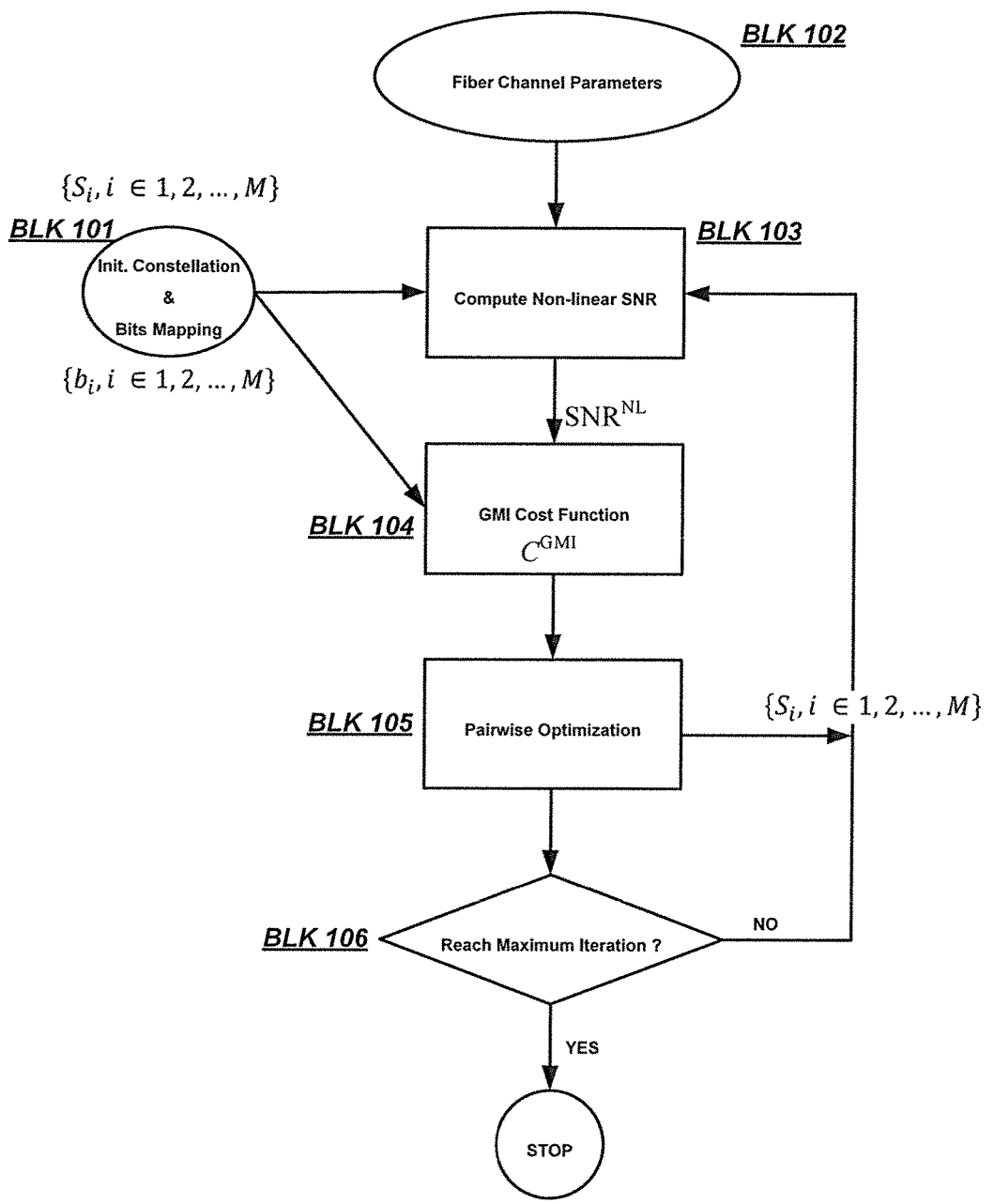
FIG. 2 is a schematic flow diagram showing constellation optimization over an optical channel according to aspects of the present disclosure.

Turning now to FIG. 2, there is shown a flow diagram illustrating constellation optimization according to aspects of the present disclosure. With reference to that figure, it may be observed that at BLK 101 an initial constellation with assigned bit(s) mapping namely:

$$\{S_i, i \in 1, 2, \ldots, M\}; \text{ and}$$

$$\{b_i, i \in 1, 2, \ldots, M\};$$

is applied to BLK 103 in which computes non-linear SNR to compute the moments of the given constellation points:

$$\frac{E[|S|^4]}{E[|S|^2]^2}$$

and $$\frac{E[|S|^6]}{E[|S|^2]^3}$$

In order to optimize the constellation in the target transmission channel, link parameters and system setup should be provided in BLK 102 such as fiber dispersion, nonlinearity coefficients, span length, noise figure(s), channel spacing, and symbol baudrate—among others. It is desirable to optimize the constellation at the slightly higher than optimum channel power to account for any nonlinearity impact on the constellation design. Note that all the fiber nonlinearity coefficients and linear amplifier noise are fixed. The calculated moments scale up/down the nonlinear noise such that the calculation in the BLK 102 is carried out only once to save computation cost.

Given the constellation and channel parameters, the received nonlinear signal-to-noise ratio (SNR) including both linear amplifier noise and modulation-dependent nonlinear noise is determined at BLK 103. At the received $SNR^{NL}$ generalized mutual information (GMI) capacity is determined at BLK 104 based on the bits mapping and constellation symbols.

Figure 3:
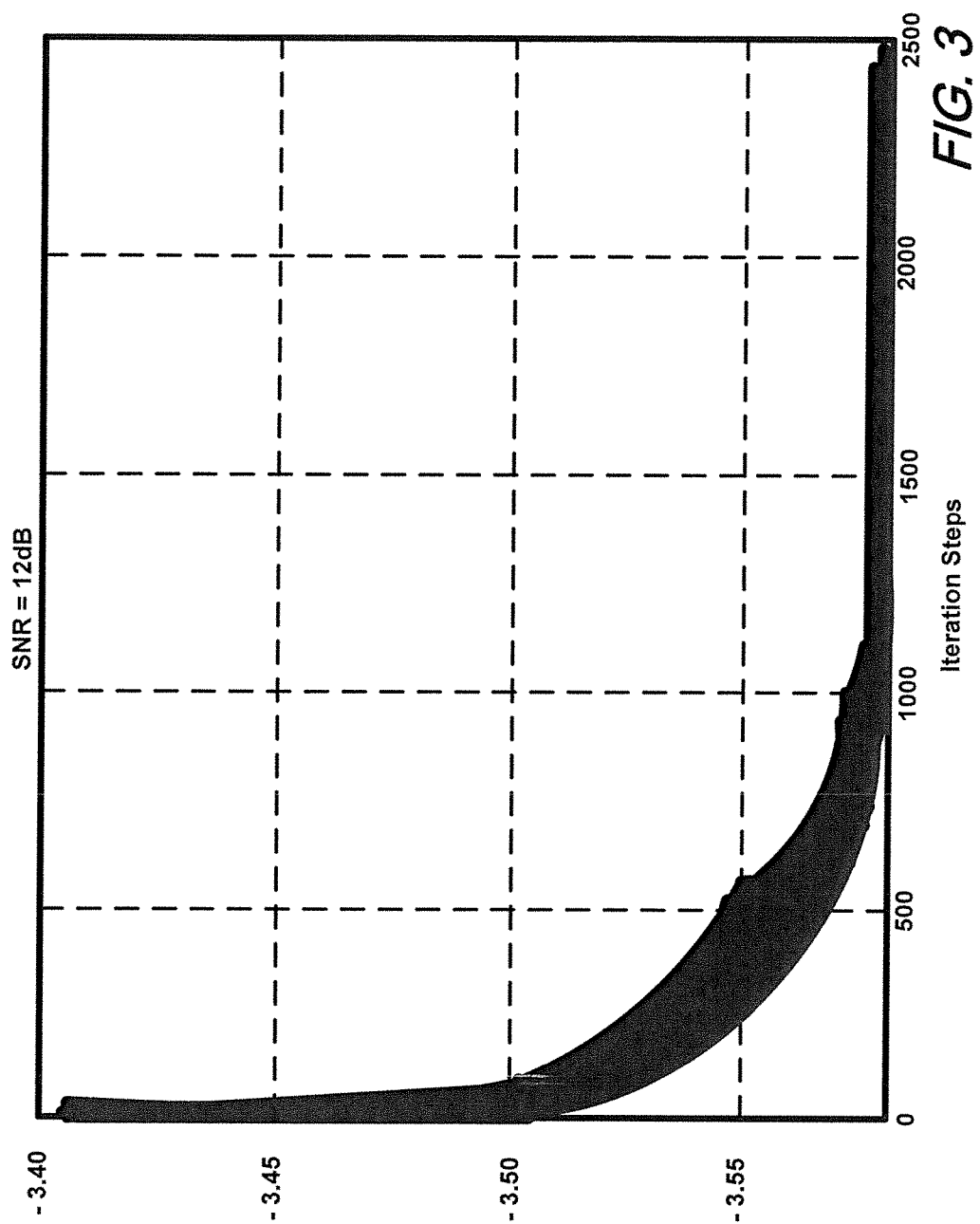
FIG. 3 is a plot illustrating GMI capacity traces in the optimization according to aspects of the present disclosure.

The GMI capacity is used as a cost function to guide the optimization procedure performed in BLK 105—where pairwise optimization is applied to reduce optimization complexity. With the new constellation derived in the pairwise optimization (BLK 105), the new moments are used to compute the received $SNR^{NL}$ which is fed into the next iteration for determining GMI cost function. The iterations continue until reaching the maximum or steady state—for example—the increment of GMI cost is smaller than the target range. The optimization trace of GMI is shown and plotted in FIG. 3.

Figure 4:
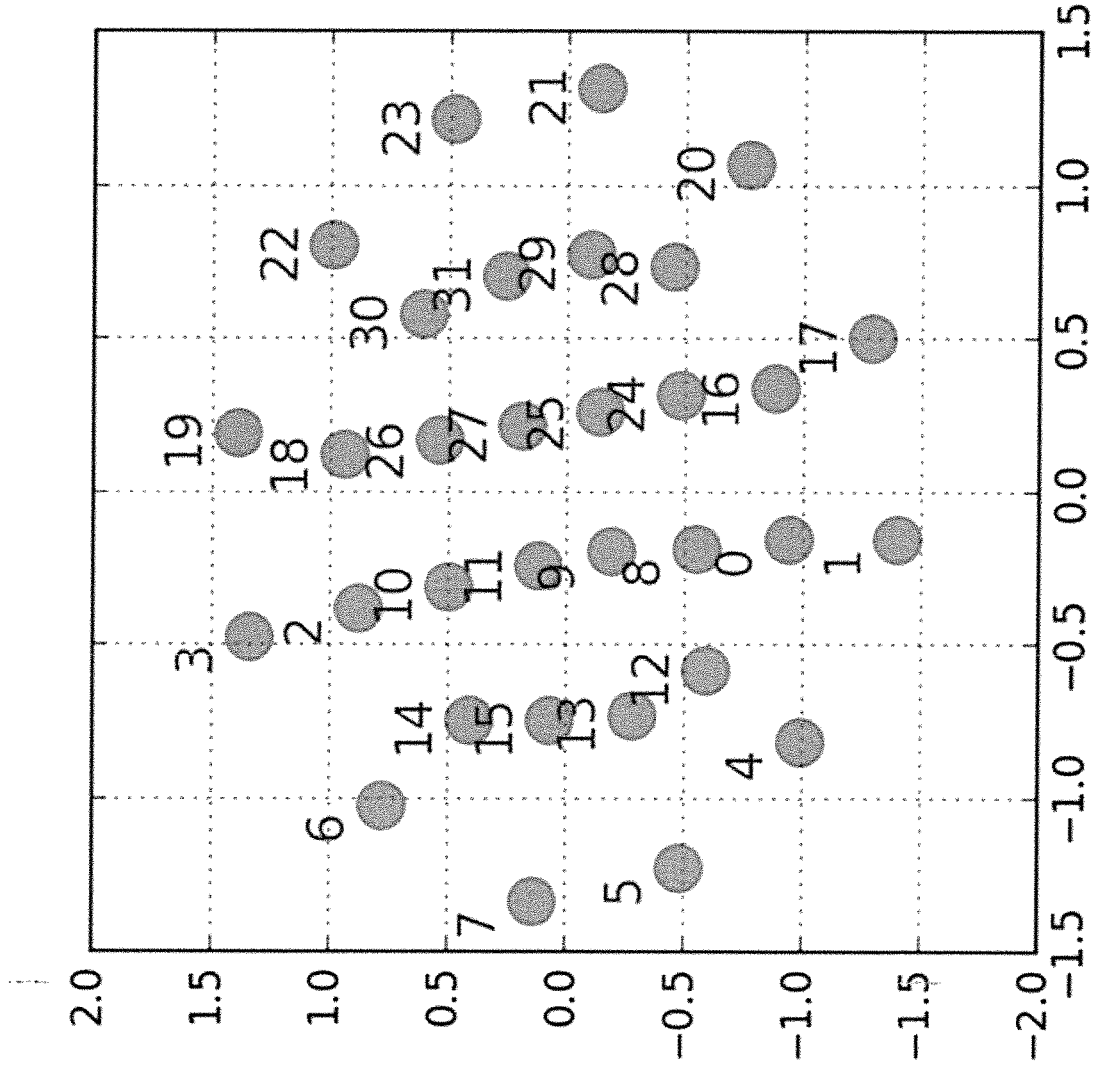
FIG. 4 is a plot illustrating optimized 32 QAM according to aspects of the present disclosure.
Figure 5:
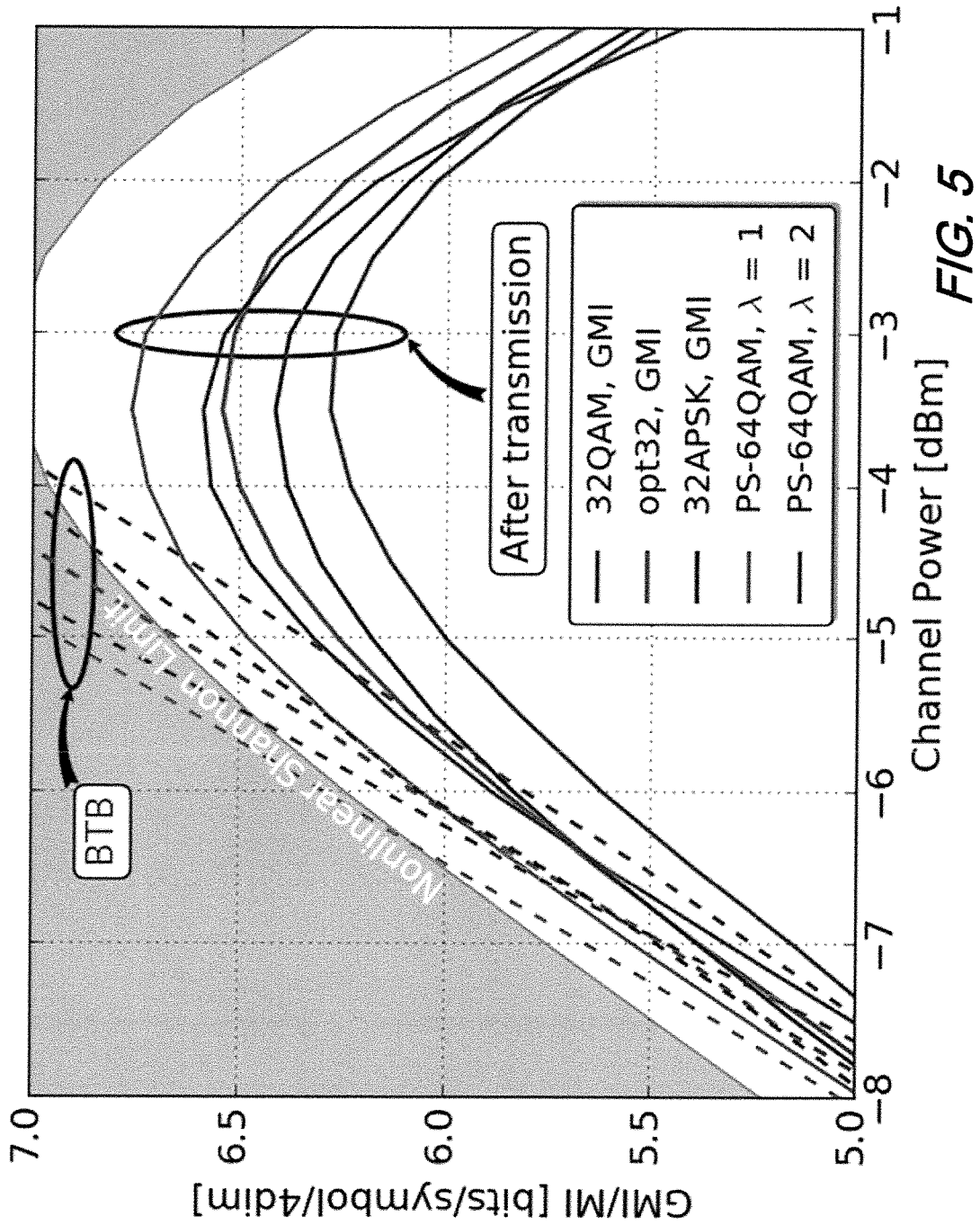
FIG. 5 is a plot illustrating GMI capacity analysis over 336×60 km transmission according to aspects of the present disclosure.

Using 32QAM as an initial constellation, the resulting optimized 32QAM (opt32) is shown in FIG. 4, and its coordinates are presented in Table 1. FIG. 5 is a plot illustrating GMI capacity analysis over 336×60 km transmission according to the present disclosure. It is plotted to compare with geometrical-shaped 32APSK and 32QAM after 336×60 km Vascade EX3000 at 5 dB noise figure. The capacity analysis shows similar GMI capacity between opt32 and 32QAM up to 6.5 b/s/4-dim, however, the nonlinearity tolerance of 32APSK is much worse than nonlinearity—optimized opt32 because methods according to the present disclosure consider both linear and nonlinear noise. Note that opt32 outperforms 32QM by 0.4 b/s/4-dim at optimum channel power.

TABLE 1

| Symbol Index | Constellation Coordinates |
| --- | --- |
| 0 | −0.155 − 0.944i |
| 1 | −0.155 − 1.398i |
| 2 | −0.379 + 0.876i |
| 3 | −0.476 + 1.338i |
| 4 | −0.812 − 0.989i |
| 5 | −1.225 − 0.479i |
| 6 | −1.023 + 0.777i |
| 7 | −1.335 + 0.141i |
| 8 | −0.186 − 0.550i |
| 9 | −0.199 − 0.194i |
| 10 | −.310 + 0.499i |
| 11 | −0.245 + 0.124i |
| 12 | −0.582 − 0.587i |
| 13 | −0.728 − 0.277i |
| 14 | −0.742 + 0.412i |
| 15 | −0.742 + 0.074i |
| 16 | 0.337 − 0.877i |
| 17 | 0.505 − 1.293i |
| 18 | 0.119 + 0.944i |
| 19 | 0.192 + 1.139i |
| 20 | 1.067 − 0.769i |
| 21 | 1.317 − 0.136i |
| 22 | 0.804 + 0.993i |
| 23 | 1.214 + 0.0484i |
| 24 | 0.315 − 0.485i |
| 25 | 0.258 − 0.140i |
| 26 | 0.165 + 0.540i |
| 27 | 0.213 + 0.194i |
| 28 | 0.730 − 0.450i |
| 29 | 0.772 − 0.095i |
| 30 | 0.582 + 0.611i |
| 31 | 0.706 + 0.264i |

With this description in place, we now show some particular illustrative application of the teachings according to the present disclosure. In this illustrative application, we used nonlinearity optimized 32QAM (opt32) modulation and C+L band transmission in a bidirectional configuration to achieve the largest capacity-distance product of 570 Pb/s-km and largest SE-distance (spectral efficiency) product of 70465.5 b/s/Hz-km to date using single-core fiber at 1 1185 km. Our results show that GS opt32 can achieve similar transmission reach as PS-64QAM with a much simpler implementation complexity.

As will be readily appreciated by those skilled in the art, performance of modulation formats is not only determined by their theoretical capacity in the linear additive noise regime, but also by their nonlinearity tolerance (NLT), and their implementation penalty. Moreover, the implementation complexity must be considered when choosing between modulations of similar performance.

PS-64QAM is shown to have high receiver sensitivity, especially when it is compared to 32QAM which has a low GMI because of non-Gray mapping. For instance, the advantage of PS-64QAM is less since GS APSK can be designed with Gray-mapping. However, such comparisons should be extended to the nonlinear regime, as both PS-64QAM and APSK suffer from reduced NLT compared to 32QAM.

As is known, efforts have been made to improve upon NLT of PS-64QAM, however with little resulting improvement. We show that instead, we can start with 32QAM which has a higher NLT and by using a GS optimization procedure based on a pairwise optimization, we can increase its receiver sensitivity while retaining its NLT. The resulting opt32 constellation and bits mapping are shown in FIG. 6(A).

Figure 6:
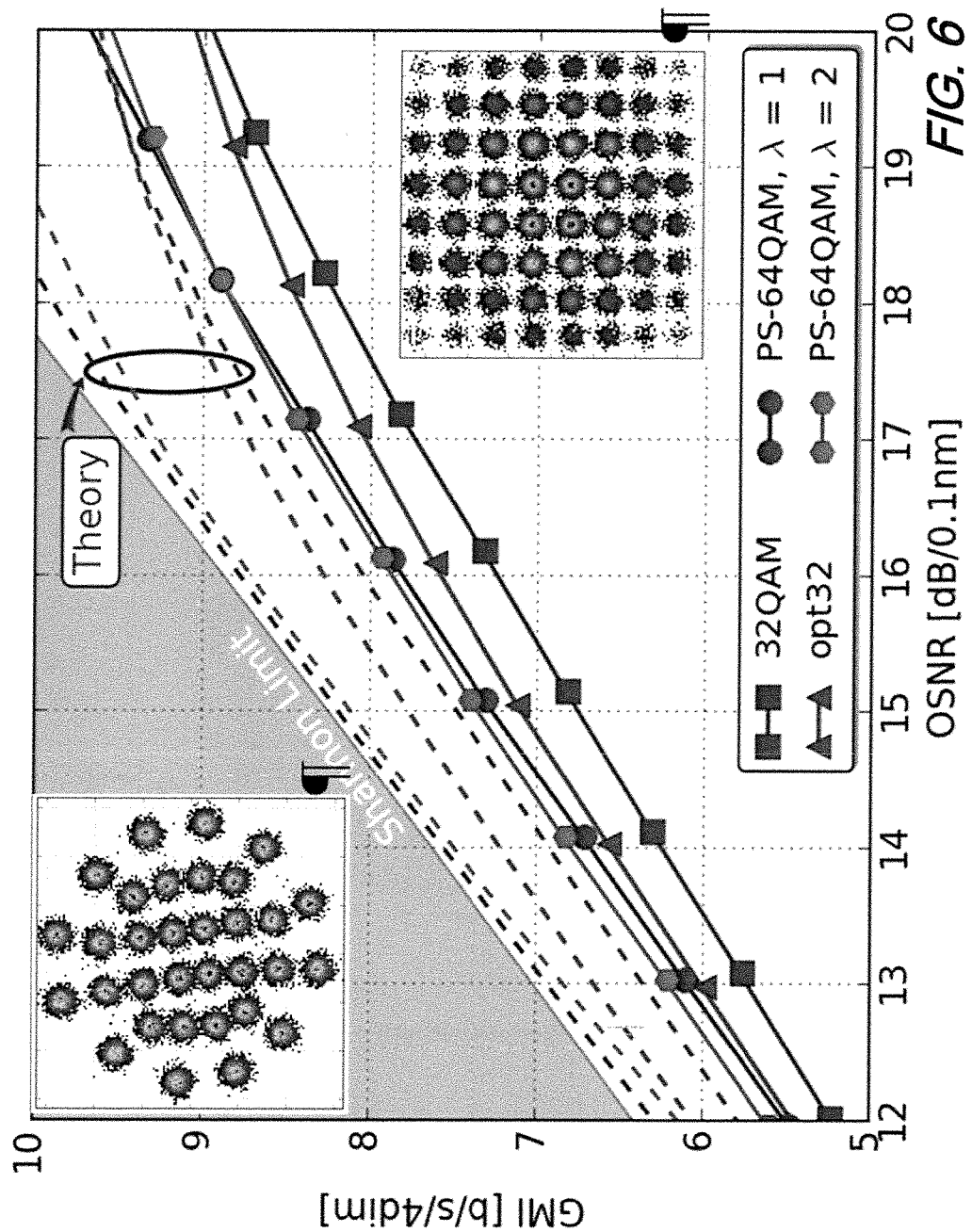
FIG. 6 is a plot illustrating a constellation of opt32 and left-MSB bits mapping according to aspects of the present disclosure.

As will be appreciated, the bit mapping is not perfect Gray-mapping as it would be for APSK, and GMT suffers a 0.2 dB signal-to-noise ratio (SNR) penalty as compared to mutual information in the linear regime, however, GMT of opt32 is 0.4 b/Hz higher compared to a 4-ring 32 APSK at optimum power as shown in FIG. 6(B).

Note that the nonlinear GMT in FIG. 6(B) is calculated from the nonlinear SNR estimated by an analytical model assuming an optical link with 336×60 km Vascade EX3000 spans, amplifiers with 5 dB noise figure (NF), and 24.8 Gbaud channels at 25 GHz channel spacing. Even with the NLT optimization, the gap between the opt32 and PS64QAM remains—especially for scenarios where $\lambda=1$.

We note further that since the DSP implementation penalty is not included in the nonlinear GMI analysis, back-to-back experimental comparison has been performed in FIG. 6(C) between opt32, 32QAM and PS-64QAM selected from Maxwell-Boltzmann (MB) distribution $P(x) \propto \exp(-\lambda|x|^2)$ at different $\lambda$.

In theory, PS-64QAM is better than opt32 by 0.3 b/s/Hz between 6 and 7 b/s/Hz. However, because of a higher implementation penalty of PS-64QAM, this difference disappears especially for $\lambda=1$. We attribute the higher implementation penalty of PS-64QAM at lower $\lambda$ to an increased symbol error rate. By comparing FIG. 6(B) and FIG. 6(C) we see that that the theoretical advantage of PS-64QAM over opt32 is limited because of higher implementation penalty at low X, and because of low NLT at higher X.

In terms of implementation complexity, opt32 does not require additional coding blocks however, PS requires an essential distribution matcher (DM) to encode uniform independent binary bits into non-uniform signaling. Although fixed-to-fixed length DM is desirable to avoid buffer overflow and error propagation from variable length DM, it requires high computational complexity and usually large codebook length to reduce information divergence Those skilled in the art will appreciate and understand that C+L band transmission has been proposed as a way to increase the capacity per fiber 11. However, the combined transmission requires the C and L bands to be split and recombined at the amplification stage, conventionally by using band filters (BF). The BFs at the input and output of the EDFAs effectively increase the amplifiers' NF while degrading their power efficiency. To mitigate the impact of the BFs on the NF, we use bidirectional configuration where the bands propagate in opposite directions.

Figure 7A:
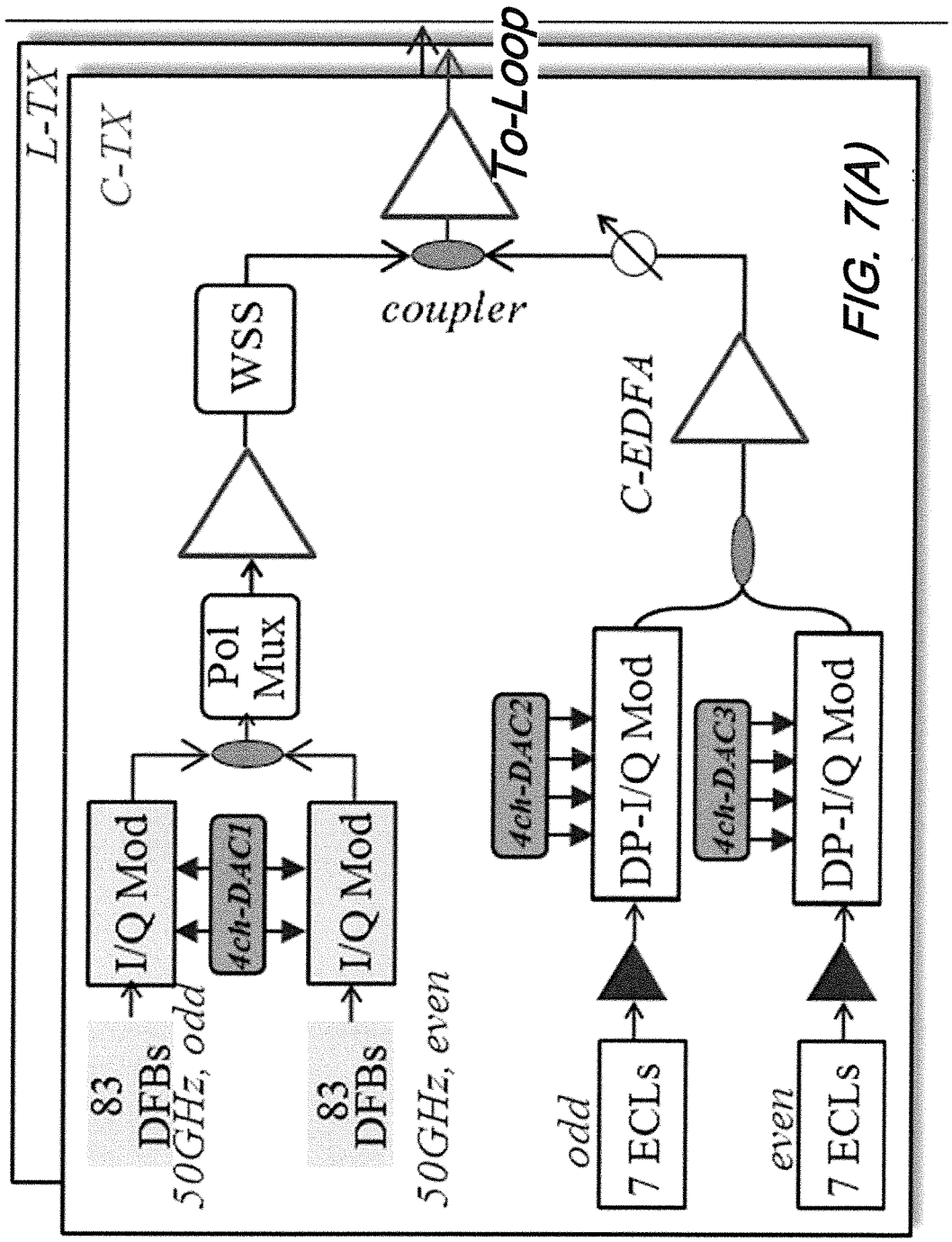
FIG. 7(A), FIG. 7(B), FIG. 7(C) are plots illustrating.
Figure 7B:
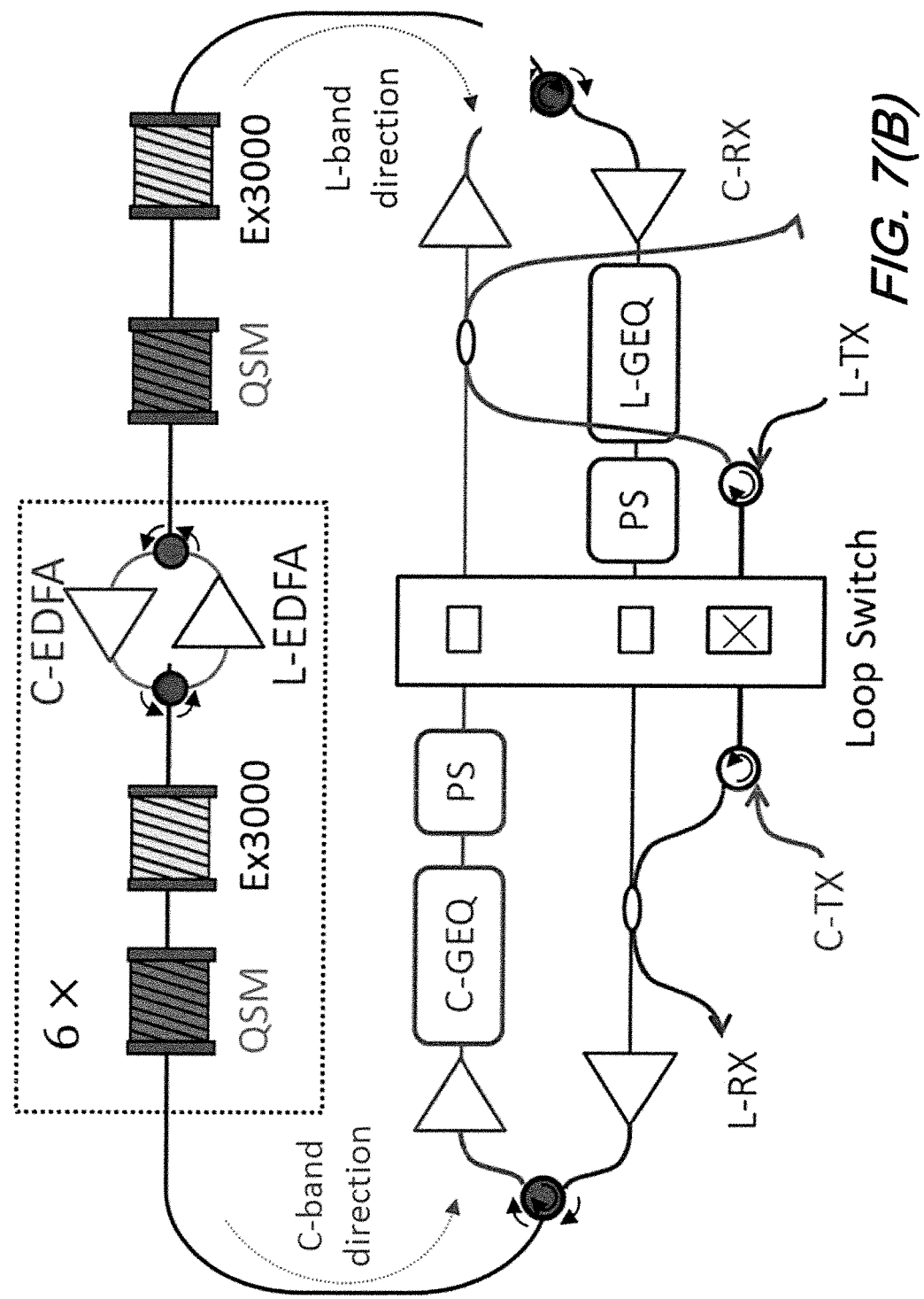

In this case the BFs can be replaced by circulators as shown in FIG. 7(B). Wide-band circulators can have similar insertion loss as BFs, while providing a better isolation between the bands. Moreover, the isolators at the EDFA input can be removed and therefore EDFA NF is effectively reduced. However, additional BFs are needed at the EDFA output to avoid double Rayleigh scattering, therefore, the power efficiency is lower.

FIG. 7(A) illustrates transmitter setup in C-band, where 166 CW DFB lasers at 25 GHz spacing from 1530.33 nm to 1563.25 nm are divided into odd and even rails. Each rail is modulated independently by 64 Gsa/s DAC to generate 24.8 Gbaud opt32 signals, and is combined into full C-band loading channels after polarization multiplexing. The 14 testing channels modulated by dual-polarization I/Q modulators are inserted into the gap of loading channels opened up by wavelength selective switch (WSS), and is sent to the bi-directional recirculating loop (FIG. 7(B)). Similar to the C-band, the L-band loading channels generally comprise 166 wavelengths spanning from 1569.18 nm to 1603.81 nm are fed into the opposite direction to the C-band signals As illustratively configured, the recirculating loop seven ~55.1 km hybrid quasi-single mode (QSM) fiber and Vascade EX3000 fiber with an average 10 dB span loss including splicing loss and 0.3 dB loss per circulator. In a bi-directional configuration, hybrid spans can reduce a nonlinear penalty only for one of the bands—L band in this case—as opposed to a unidirectional configuration. Nevertheless, the bi-directional configuration is chosen to reduce NF for both bands.

Figure 7C:
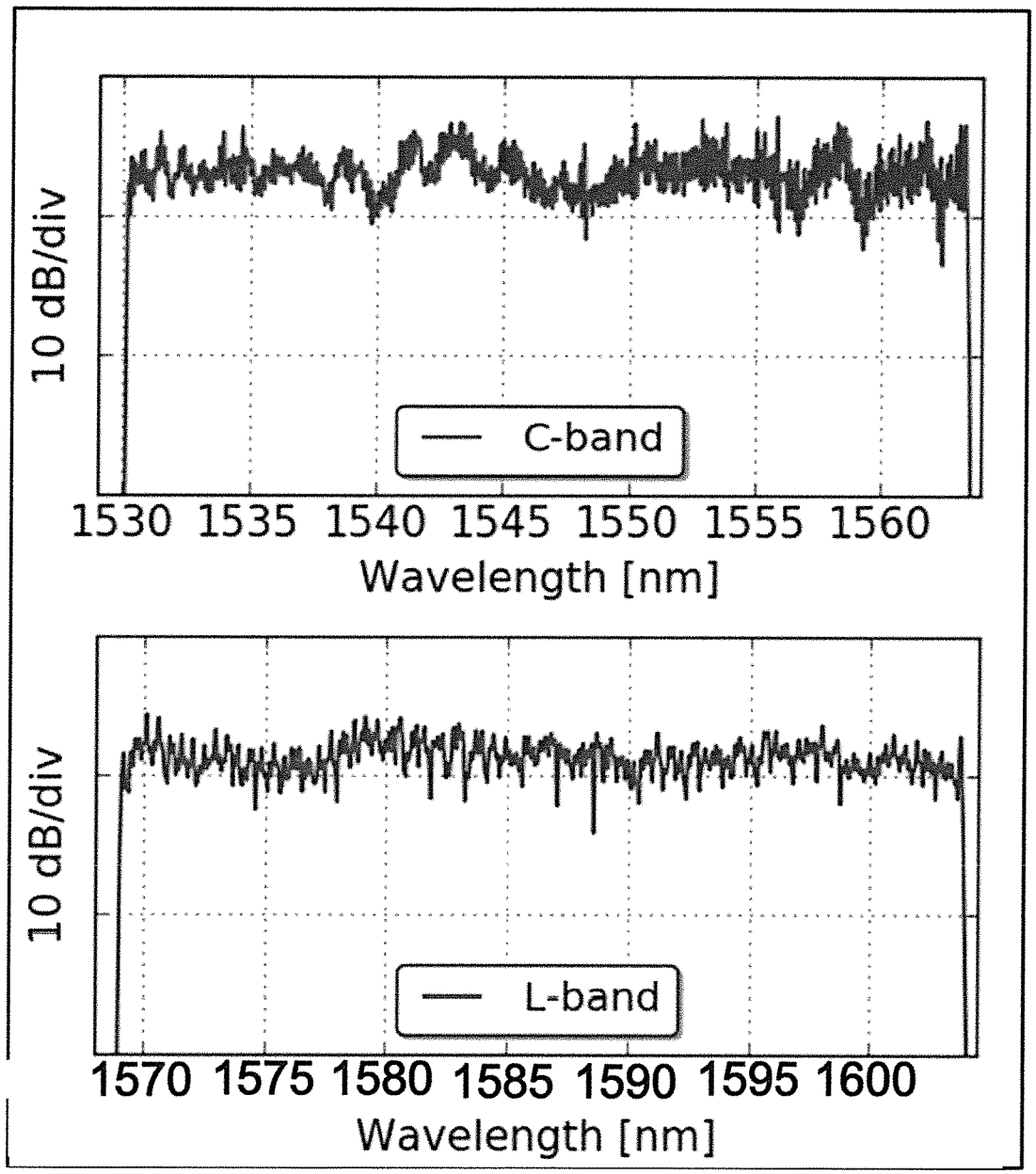

Gain equalizer (GEQ) is used in each band to balance the EDFA gain tilt and loop synchronized polarization scrambler to avoid spurious polarization effects from recirculation. The total launch power of both C and L EDFA is ~22 dBm, with an average NF of 4.3 dB and 4.8 dB, respectively, including the circulator loss. The received C and L-band spectra after 11185 km transmission are plotted in FIG. 7(C).

The testing channels are generated from a PRBS order of $2^{18}-1$ encoded by binary LDPC codes described previously and then mapped into the selected modulation formats. The up-converted signals are shaped into root-raised-cosine 0.01 to reduce the crosstalk from WDM neighbors. At the receiver side, the coherently detected signals are sampled and digitized by an 80 GSa/s real-time scope with 36 GHz bandwidth to perform multi-channel nonlinearity compensation (NLC). Additional 2% overhead has been inserted for all the formats to assist the convergence of polarization de-multiplexing and cycle-slip removal. The LDPC decoder is implemented using sum product algorithm with 50 inner-iterations.

Figure 8:
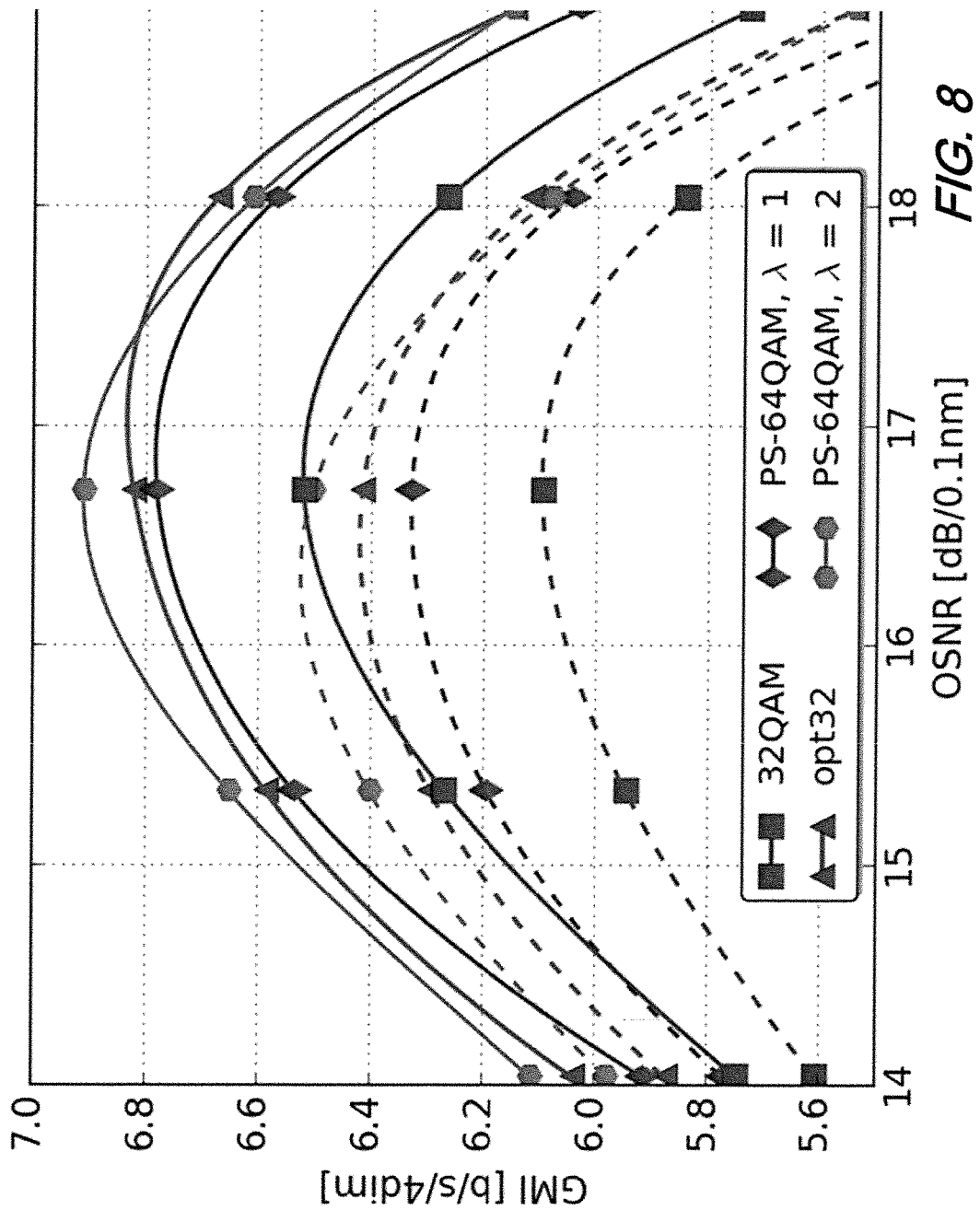
FIG. 8 is a plot illustrating measured GMI of different formats versus received OSNR after 11185 km according to aspects of the present disclosure.
Figure 9:
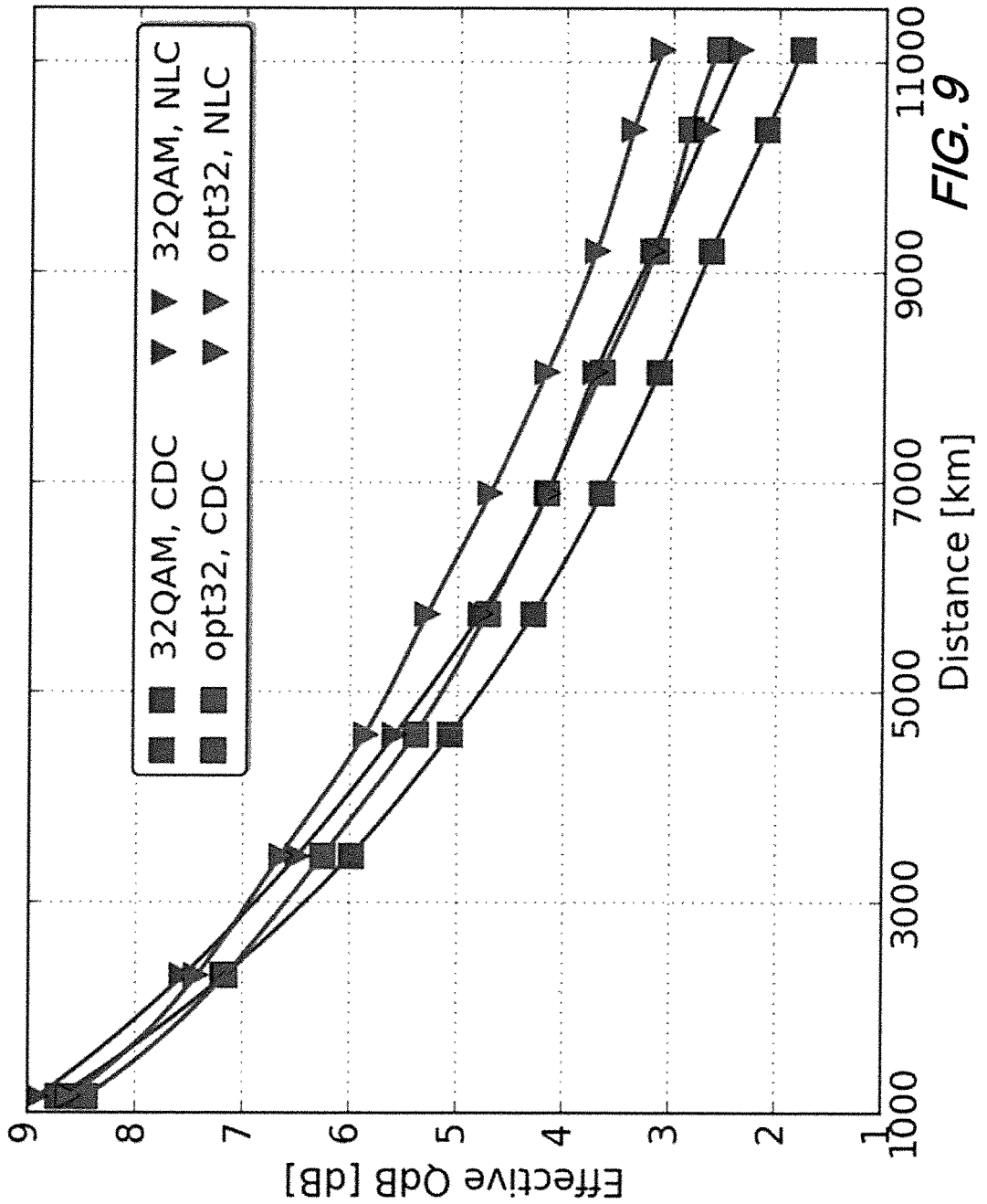
FIG. 9 is a plot illustrating Q versus distance for 32 QAM and opt32 at 1591.68 nm with CDC and NLC according to aspects of the present disclosure.

The measured GMT of 32QAM, opt32, and PS-64QAM is measured in FIG. 8 as a function of the received OSNR/0.1 nm at BTB and after 11185 km transmission. As expected from BTB measurements, and the analysis in FIG. 6(B), the GMT improvement of opt32 over 32QAM remains ~0.3 b/s/4dim in both the linear and nonlinear regime to demonstrate their similar nonlinearity tolerance. About 0.4 b/s/4dim NLC benefit is observed at the optimum 16.7 dB OSNR to achieve ~6.8 b/s/4dim GM capacity for opt32. The transmission performance versus distances is plotted in FIG. 9, where opt32's transmission reach has been increased by ~16⁰/0 at the FEC limit of 2.95 dB, agreeing with the measured BTB results and GMI capacity analysis.

Figure 10:
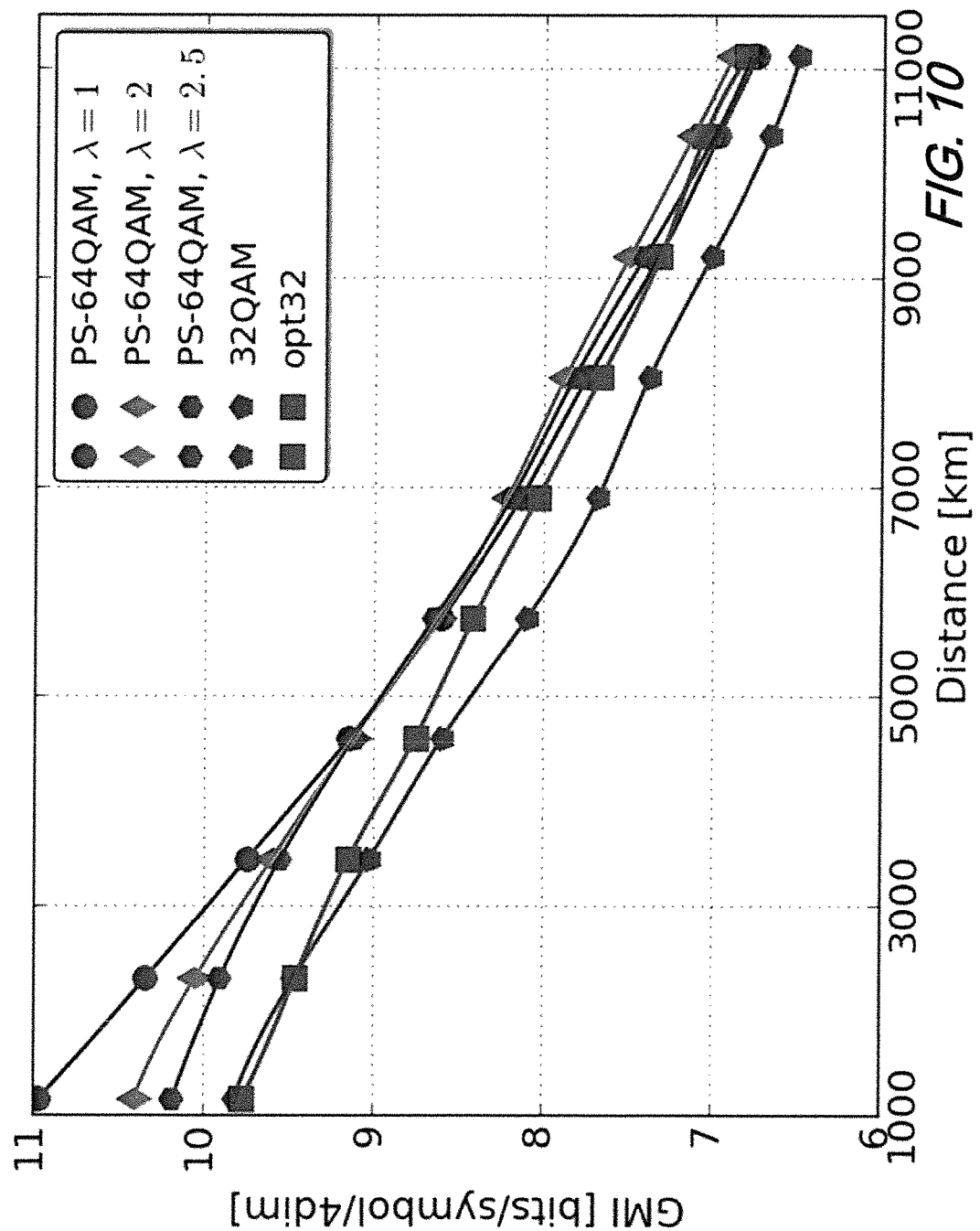
FIG. 10 is a plot illustrating GMI comparison between prob. 64QAM, 32QAM and opt32 at 1591.68 nm with NLC according to aspects of the present disclosure.
Figure 11:
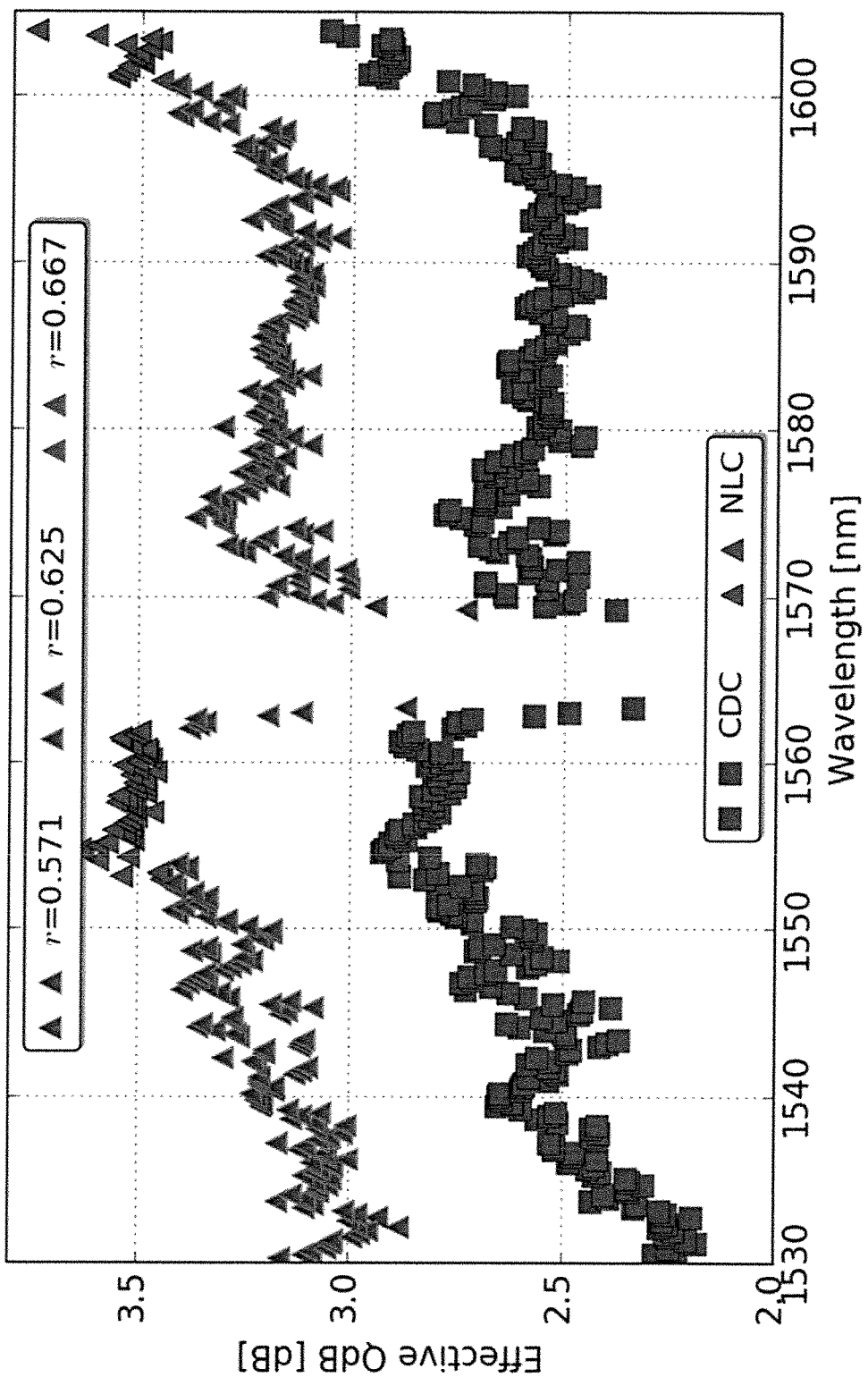
FIG. 11 is a plot illustrating recovered Q-factor after CDC and NLC for 332 channels at 50.96 Tb/s transmission over 11185 km according to aspects of the present disclosure.
Figure 12:
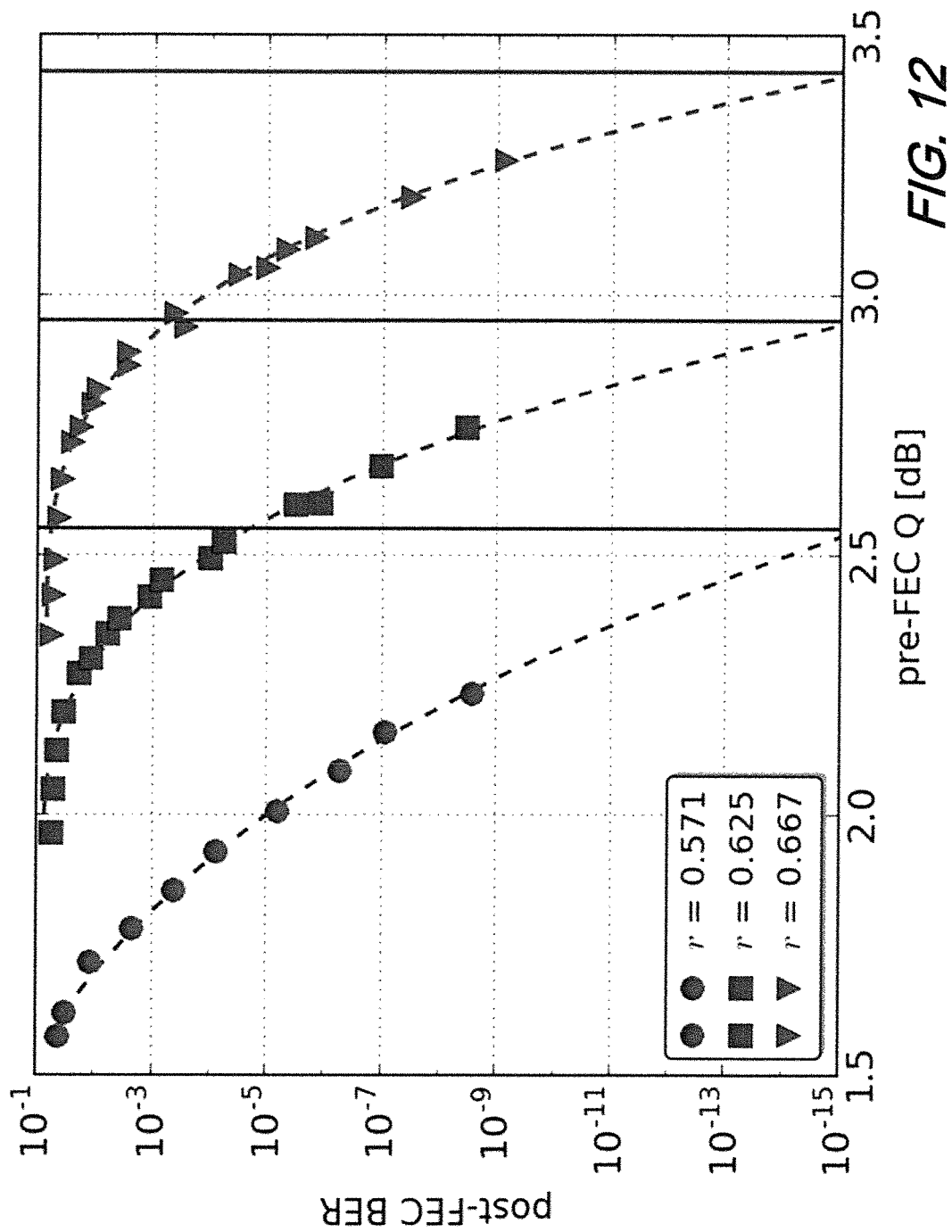
FIG. 12 is a plot illustrating measured FEC decoding performance of opt32 at coding rates: 0.571, 0.625, and 0.667 according to aspects of the present disclosure.

The achievable GMI of PS-64QAM is also measured to compare with the proposed opt32 as a function of transmission distance. PS-64QAM performs much better than opt32 at shorter distances due—in part—to the near-Shannon BTB performance. However, as the distance reaches >10000 km, the GMI capacity gap between PS-64QAM and opt32 quickly diminishes as a result of two reasons: first, the gap between Ps-64QAM and opt32 at <7 is smaller than the one at high GMI capacity (FIG. 6(C)); second, the nonlinearity tolerance of PS-64QAM is worse than opt32 due to the infrequent high-power symbols. Similar transmission reach in FIG. 10 is found for both PS-64QAM at the optimum shaping and opt32 after NLC All 332 channels modulated by opt32 are recovered after 11185 km by NLC and CDC in FIG. 11. The channels at longer wavelengths of both C and L bands perform better than those channels at shorter wavelengths in each band. Three coding rates at 0.571, 0.625 and 0.667 generated by binary quasi-cyclic regular LDPC with column weight 3 and girth 10 are applied to deal with the transmission performance tilt. Their FEC thresholds with BICM opt32 are estimated in FIG. 12 at 2.55 dB, 2.95 dB and 3.43 dB at the post-FEC BER of $10^{-15}$. All the NLC channels are decoded successfully at the corresponding coding rates shown in FIG. 11, leading to a successful (5×0.571+270×0.625+57×0.667)×24.8/1.02=50.967 Tb/s transmission over 11185 km at 6.3 b/s/Hz SE. The product of capacity×distance 570 Pb/s•km is the highest reported to date.

At this point, while we have presented this disclosure using some specific examples, those skilled in the art will recognize that our teachings are not so limited. Accordingly, this disclosure should be only limited by the scope of the claims attached hereto.

The invention claimed is:

1. A computer implemented method of generating an optimized constellation for an optical fiber network including one or more optical channels, the method comprising: by the computer:
   receiving by the computer for one of the one or more optical channels, a target constellation X with assigned bit mapping and geometric shape, wherein X is taken from an N-dim signal constellation $\{X_1, X_2, ---, X_M\}$ at a specified probability mass function (PMF) given by $p(Xi)$, $i \in \{1, 2, ---, M\}$;
   receiving by the computer for the one of the one or more optical channels, channel parameters for the one channel including fiber dispersion, nonlinearity coefficients, span length, noise figures, channel spacing and symbol baudrate;
   determining by the computer for the one of the one or more optical channels using the target constellation and the channel parameters, a received nonlinear signal-to-noise ratio (SNR) including both linear amplifier noise and modulation-dependent nonlinear noise;
   iteratively determining for the received nonlinear SNR, a generalized mutual information (GMI) cost function by generating random symbols from the target constellation X following a given PMF $p(xi)$, the GMI determined according to the following relationship:

$$R_{GMI} = H(X) + \sum_{i=1}^{log_2 M} \left\langle log_2 \left[ \frac{b_i(j) \cdot L_1(j) + (1 - b_i(j)) \cdot L_0(j)}{p_y(j)} \right] \right\rangle,$$

where $b_i(j) \varepsilon \{0,1\}$ denotes transmitted bits for jth symbol at ith bit and $P_y(j)$ is a probability of a received jth symbol $Y(j)$, and operator $\langle \cdot \rangle$ represents an arithmetic average over all a simulated symbol index j;
   $L_0$ and $L_1$ represent a bit likelihood (L) for the received jth symbol $Y(j)$, which is determined according to the following relationship:

$$L_{b_i=0,1}^j \sum_{x^{b_i=0,1}} p(y(j) | x^{b_i=0,1}) p(x^{b_i=0,1}) =$$

$$\sum_{x^{b_i=0,1}} (2\pi\sigma^2)^{-n/2} \exp\left(-\frac{\|y(j) - x^{b_i=0,1}\|^2}{2\sigma^2}\right) p(x^{b_i=0,1}),$$

Where $\sigma_2 \triangleq \sigma_n^2/N$ is a noise variance in each dimension; and
   continuing with the iteratively determining until an increment of GMI cost function is less than a target range.

\* \* \* \* \*